United States Patent
Macchiarella et al.

(10) Patent No.: US 6,267,020 B1
(45) Date of Patent: Jul. 31, 2001

(54) DRIVE MECHANISM FOR VARIABLE CENTER DISTANCE COMPONENT INSERTION MACHINE

(75) Inventors: Robert Macchiarella; Peter J. Dionne, both of Binghamton, NY (US)

(73) Assignee: Universal Instruments Corporation, Binghamton, NY (US)

( * ) Notice: Subject to any disclaimer, the term of this patent is extended or adjusted under 35 U.S.C. 154(b) by 0 days.

(21) Appl. No.: 09/126,509

(22) Filed: Jul. 30, 1998

(51) Int. Cl.[7] ............... F16H 27/02; F16H 1/04; B23P 19/00
(52) U.S. Cl. ............. 74/89.17; 74/89.15; 74/422; 29/741; 29/739
(58) Field of Search ............... 29/741, 739; 74/422, 74/89.15, 89.17; 901/16

(56) References Cited

U.S. PATENT DOCUMENTS

| | | | |
|---|---|---|---|
| Re. 27,968 | 4/1974 | Ragard et al. | 227/2 |
| 2,896,213 | 7/1959 | Alderman et al. | 1/102 |
| 3,488,672 | 1/1970 | Martyn | 29/626 |
| 3,550,238 | 12/1970 | Allen et al. | 29/203 |
| 3,594,889 | 7/1971 | Clark | 29/203 B |
| 4,080,730 | 3/1978 | Woodmand, Jr. | 29/701 |
| 4,464,833 | 8/1984 | Duncan | 29/18 |
| 4,470,182 | * 9/1984 | Zemek et al. | 29/741 X |
| 4,553,323 | 11/1985 | Clark | 29/741 |
| 4,719,810 | * 1/1988 | St. Cyr et al. | 74/89.15 |
| 5,443,791 | * 8/1995 | Cathcart et al. | 901/46 |

* cited by examiner

*Primary Examiner*—David A. Bucci
*Assistant Examiner*—Colby Hansen

(57) ABSTRACT

A drive mechanism for a variable center distance component insertion machine having a pair of component insertion tooling assemblies mounted adjacent each other so as to be laterally adjustable inwardly and outwardly relative to each other. Each tooling assembly has a gear rack mounted at its top. The racks engage an elongated pinion gear mounted proximate the toolings so as to engage the pair of tooling assembly gear racks. A servo motor rotates the pinion and, thereby, reciprocates the tooling assemblies toward and away from a circuit board. The tooling assemblies are adjusted laterally by a second servo motor coupled to the tooling assemblies by a double screw lead. During the lateral adjustment of the tooling assemblies the pair of rack gears remain in constant mesh with the elongated pinion gear.

10 Claims, 4 Drawing Sheets

DRIVE MECHANISM FOR VARIABLE CENTER DISTANCE COMPONENT INSERTION MACHINE

FIELD OF THE INVENTION

The present invention relates to a drive mechanism for the component placement heads of an automatic electrical variable center distance (VCD) component insertion machine.

BACKGROUND OF INVENTION

In the art of automatically applying axial lead electrical components to a printed circuit board, which is well known in the industry, the components are usually supplied to the insertion head of the machine in a desired sequence for insertion through the board. The components are supplied on a reel in which the component axial leads are taped on their outer extremities to present the components in a taped series to the insertion head. The insertion tooling contains a mechanism to sever the component leads from the tape, form the leads at a right angle to the component body, and insert the leads into pre-selected openings in the board. Thereafter, a cut-clinch mechanism cuts and forms the leads protruding through the board undersurface to lock the component to the board. Insertion heads of this type are disclosed in U.S. Pat. No. Re 27,968.

In the operation of these heads, there is a pair of vertically driven insertion tooling assemblies which travel from a position to receive the component from the taped input to a position to insert the component leads into the openings in the board. The mechanism to vertically reciprocate the insertion tooling has, in the past, been a pneumatic cylinder arrangement (such as illustrated in U.S. Pat. No. 27,968) which drives a linkage causing the placement head to move up and down or a servo driven lead screw (such as illustrated in U.S. Pat. No. 4,719,810).

In addition to the above considerations, during the insertion sequence of axial lead components (e.g., resistors, diodes, etc.) it is also desirable to provide for the insertion of the leads of the components at varying center distances. Accordingly, variable center distance (VCD) component insertion machines have been developed. In such machines, two insertion tooling assemblies (one for each lead) are simultaneously driven to sever the leads from the tape, form the leads and insert the leads into pre-selected openings in the board. The insertion toolings are laterally moveable so that the center distance between the insertion toolings may be varied to accommodate different insertion center distances.

One disadvantage of the prior art VCD insertion heads is that they employed a large mass of complicated pneumatic crank arms or lead screw mechanisms to drive the insertion heads up and down. They, therefore, were difficult to control or operate at high rates of insertions per hour.

SUMMARY OF THE INVENTION

It is, therefore, an object of the present invention to provide a high speed servo motor driven mechanism for vertically reciprocating the insertion head of a VCD component insertion machine, in particular, in excess of 24,000 insertions per hour.

It is yet another object of the present invention to provide a low mass servo motor driven mechanism for a VCD component insertion machine which allows for adjustment of the insertion width of the insertion head as part of the drive mechanism.

The above and other objects are achieved in accordance with the present invention by a drive mechanism for a variable center distance component insertion machine having a pair of tooling assemblies mounted adjacent each other so as to be laterally adjustable relative to each other. Each tooling has a gear rack mounted at its top. The racks engage an elongated pinion gear mounted proximate the toolings. A servo motor rotates the pinion and, thereby, reciprocates the toolings toward and away from a circuit board. The toolings are adjusted laterally by a second servo motor coupled to the toolings by a double lead screw.

These and other objects, features and advantages of the present invention will be apparent and fully understood from the following detailed description of the preferred embodiments, taken in connection with the appended drawings.

DETAILED DESCRIPTION OF THE PREFERRED EMBODIMENT

Figure 1:
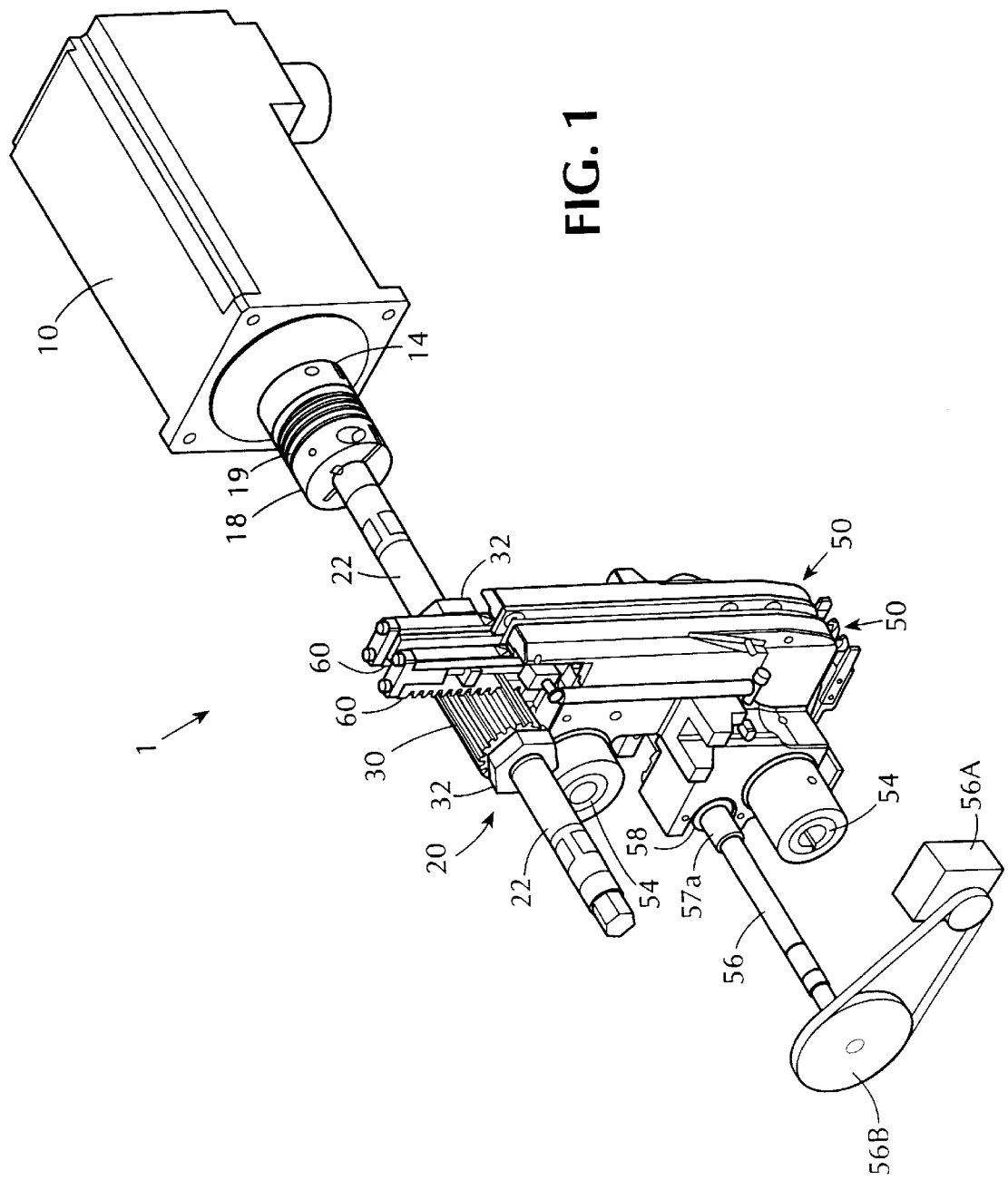
FIG. 1 is a perspective view of a drive mechanism according to the present invention.

As indicated above, the present invention overcomes the problems of existing VCD component insertion drive mechanisms by employing a rack and pinion system driven by an electric servo motor. The racks, which are mounted to the two tooling housing assemblies, are designed to be laterally moveable along the pinion, thereby allowing for the desired variable center distance adjustability of the two tooling housing assemblies. FIGS. 1–4 illustrate an exemplary embodiment of a drive mechanism 1 according to the present invention which includes a motor 10 and pinion assembly 20, and two tooling housing assemblies 50.

The pinion assembly 20 includes a pinion shaft 22 mounted to the VCD housing 100 (shown in FIGS. 3 and 4) by bearings which allow rotation of the shaft 22. A pinion gear 30 is secured to the center portion of the pinion shaft 22 by lock nuts 32. A pinion key (not shown) engages a notch in the pinion shaft 22 and a corresponding notch in the inner surface of the pinion gear 30 to prevent rotation of the pinion gear 30 relative to the pinion shaft 22. A similar coupling key engages a notch at one end of the pinion shaft 22 and a corresponding notch in the motor coupling 18, described below, to prevent rotation of the pinion shaft 22 relative to the motor coupling 18.

An electric servo motor 10 is mounted to the housing 100 at spacer section 110, adjacent to the pinion shaft 22, and the motor drive shaft 14 extends into the area defined by spacer section 110 of the housing 100. The end of the pinion shaft 22 with the lock key extends through the appropriate aperture into the same area defined by spacer section 110. The pinion shaft 22 and the motor drive shaft 14 are axially aligned and connected by the motor coupling 18. A coupling key engages a notch in the motor drive shaft 14 and a corresponding notch in the motor coupling 18 to prevent rotation of the motor drive shaft 14 relative to the motor coupling 18. Accordingly, the pinion shaft 22 is driven by the motor 10 by way of the motor coupling 18.

The motor coupling 18 provides a flexible coupling between the pinion shaft 22 and the motor drive shaft 14 to prevent relative rotation between the two, while at the same time allowing for slight misalignment of the two shafts. In the illustrated embodiment, the motor coupling 18 is an aluminum cylinder with slots 19 cut helically around its midsection. This results in a spring-like structure that allows for bending of the motor coupling 18 in all directions while rotating. It should be apparent that other flexible couplings, such as rubber, or universal joints may be employed to achieve the same result. Further, the flexible motor coupling 18 may be omitted if manufacturing tolerances are such that there is no significant misalignment of the drive shaft 14 and pinion shaft 22.

Figure 2:
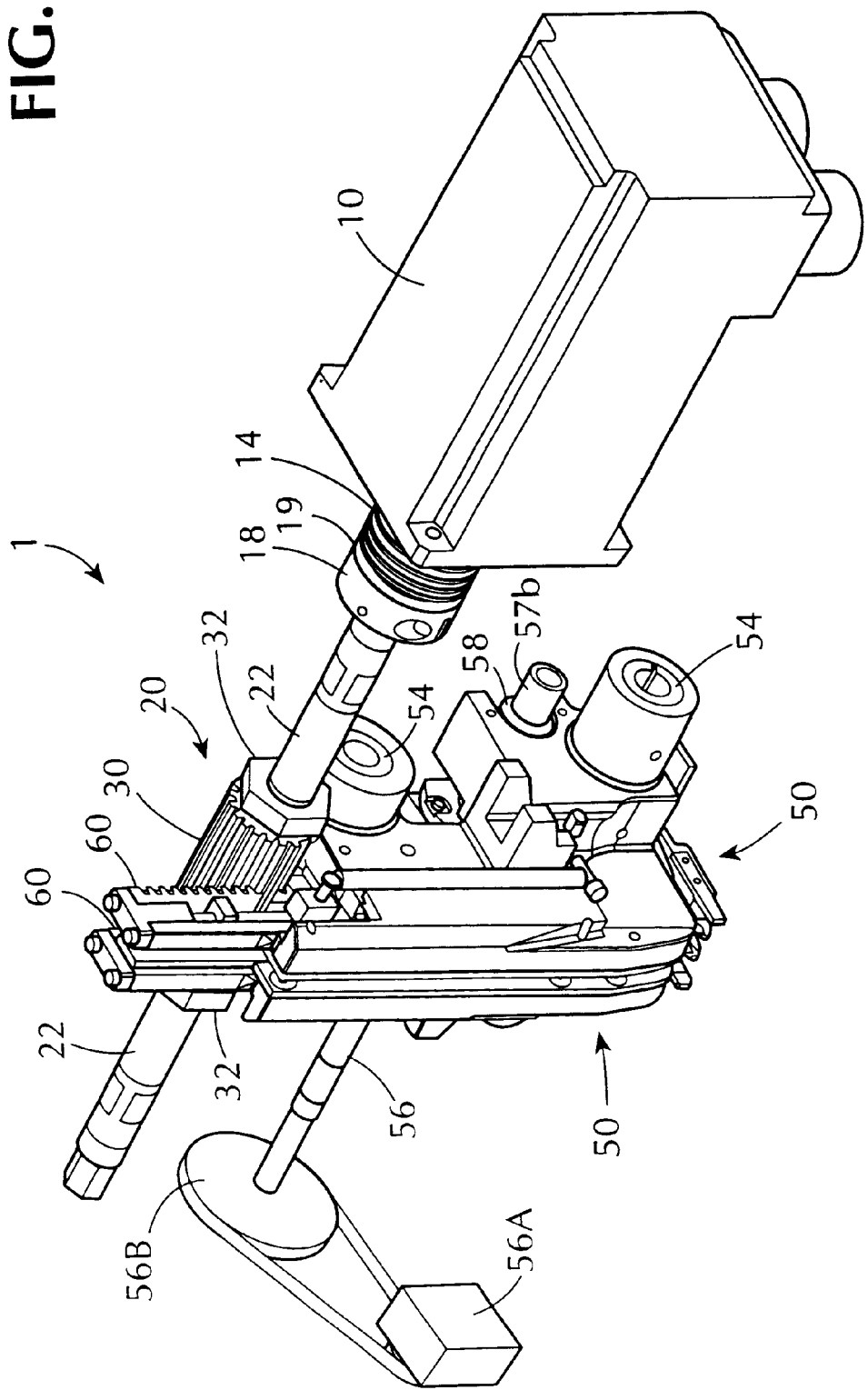
FIG. 2 is a reverse perspective view of the drive mechanism of FIG. 1.

The tooling housing assemblies 50, best seen in FIGS. 1 and 2, include the tooling (i.e., the shear blade, outside former, inside former and driver tip) to sever the component leads from the feed tape, form the leads at a right angle to the component body and insert the leads into pre-selected openings in the board, as is known in the art. The tooling housing assemblies 50 are supported within the housing 100 by a pair of bearing shafts (not shown), which are mounted to the housing 100. Linear bearings 54 mounted to the tooling housing assemblies 50 slide along the bearing shafts to provide for lateral movement of the tooling housing assemblies 50 with respect to one another.

The tooling housing assemblies 50 are driven laterally by a double screw lead 56, which is disposed within the housing and oriented parallel to the bearing shafts. The double screw lead 56 has two threaded sections 57a, 57b to engage flanged threaded bushings 58 mounted to each of the tooling housing assemblies 50. One of the threaded sections 57a has a reverse thread so that when the screw lead 56 is rotated, the tooling housing assemblies 50 are either driven towards each other or away from each other, depending on the direction of rotation. The double screw lead 56 is mounted to the housing 100 by bearings and driven by a second servo motor 56A by way of a pulley assembly. The second servo motor 56A rotates the double screw lead 56 by way of the pulley assembly to move the tooling housing assemblies 50 in the lateral direction. Thus, by precisely controlling the amount of rotation of the second servo motor 56A, the lateral positioning of the tooling housing assemblies 50 with respect to each other, i.e., the center distance between them (and thus the component insertion width), may be precisely controlled.

Optionally, the second servo motor 56A may also position cut-clinch mechanism (not shown) disposed under the component board. As described above, the cut-clinch mechanism cuts and forms the leads protruding through the board undersurface to lock the component to the board. By laterally positioning the cut-clinch mechanism with the same motor as positions the tooling housing assemblies 50, the lateral alignment of the tooling housing assemblies 50 with the cut-clinch mechanism is ensured.

Figure 3:
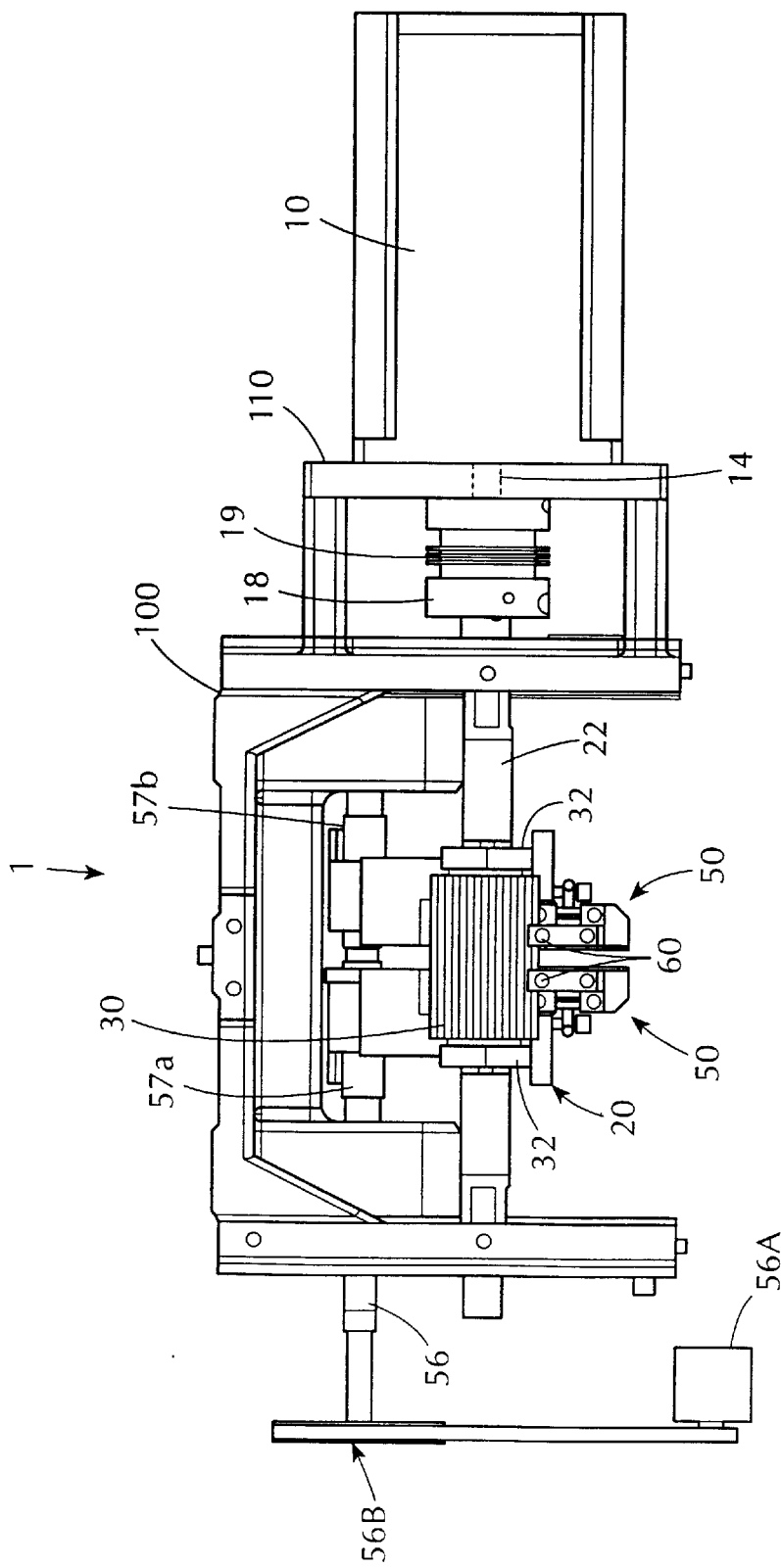
FIG. 3 is a top view of the drive mechanism of FIG. 1 and the associated housing assembly.
Figure 4:
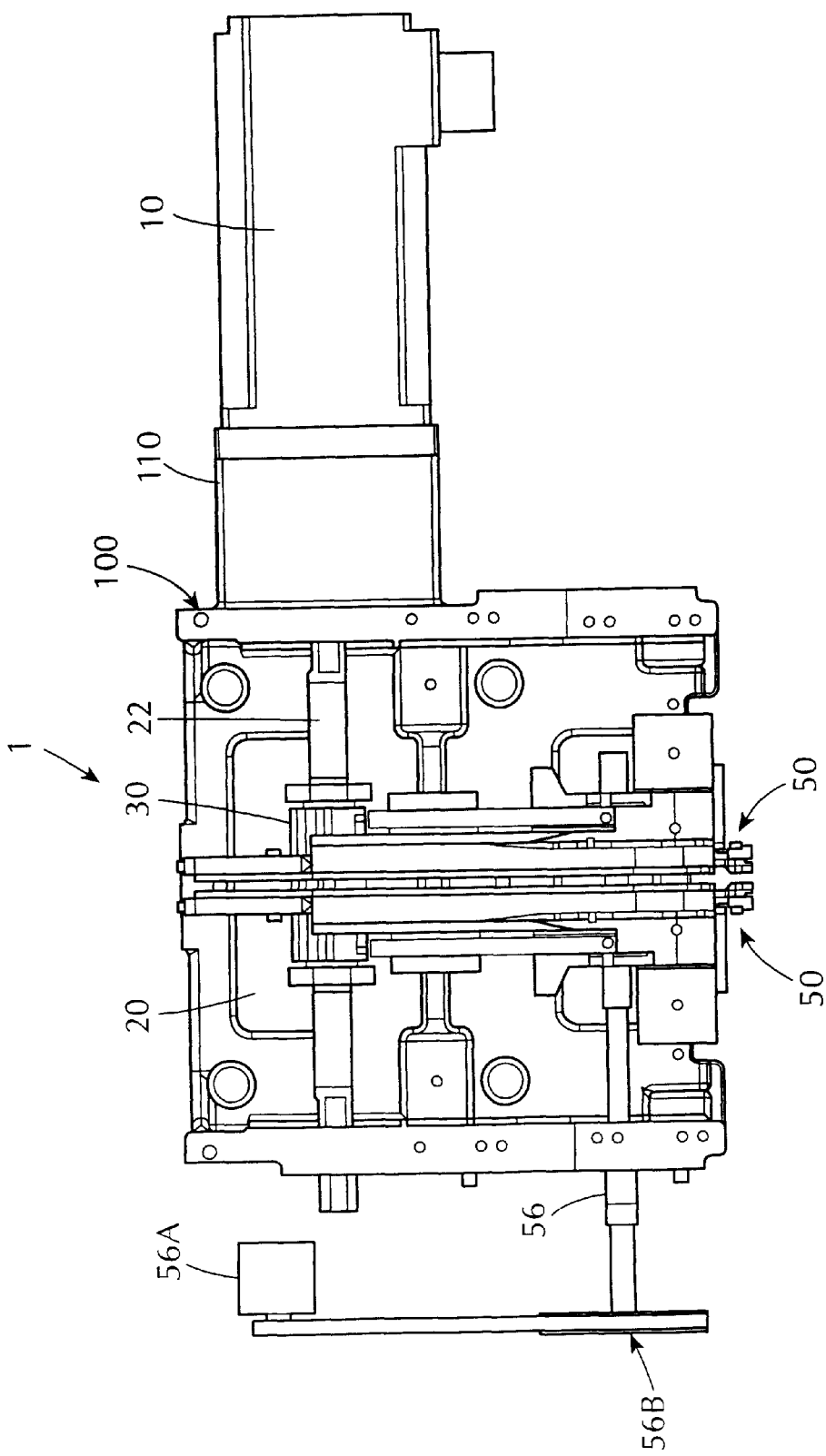
FIG. 4 is a front view of the drive mechanism of FIG. 1 and the associated housing assembly.

Mounted at the top of each of the tooling housing assemblies 50, and connected to the tooling contained therein, is a gear rack 60, designed to engage the pinion gear 30. The tooling may, thus, be moved vertically by the servo motor 10, by way of the gear racks 60 and pinion assembly 20. As best seen in FIG. 3 and 4, the pinion gear 30 is wider than the gear racks 60 so that it maintains its engagement with the gear racks 60 as the tooling housing assemblies 50 are moved laterally. Accordingly, by precisely controlling the amount of rotation of the servo motor 10, the vertical movement of the tooling (and thus the insertion depth of the components) may be precisely controlled.

In one embodiment, a component feed assembly (not shown) is mounted to the housing 100 proximate the tooling housing assemblies 50 to feed components one at a time to the tooling and a guide assembly helps direct the components from the feed assembly to the tooling. In operation, a component is indexed by the feed assembly and directed by the guide assembly to the tooling assemblies 50. The first servo motor 10 is then rotated to lower the tooling assemblies 50 and lower the cut and formed component to the circuit board below. Once inserted, the cut-clinch mechanism cuts and forms the leads protruding through the board undersurface to lock the component to the board. The first servo motor 10 is then rotated in the opposite direction to raise the tooling assemblies 50 to a position to receive the next component to be inserted. The second servo motor 56A is then rotated, if required, to laterally adjust the tooling assemblies 50 to a new desired width.

It should be apparent from the above description that the present invention has several advantages over the prior art. For example, the present invention accomplishes variable insertion depths without the need for mechanical stops through the use of a servo motor 10 as the driving force. This minimizes wear and noise. The present invention also has less inertia than prior art systems due to reduced mass and, therefore, allows for operation at higher speeds.

The present invention has been described in terms of illustrated embodiments thereof. Other embodiments, features and variations within the scope of the appended claims will, given the benefit of this disclosure, occur to those having ordinary skill in the art. For example, other methods of laterally moving the tooling housing assemblies 50, such as the use of an individual motor for each, may be employed and still be within the scope of the present invention. By the same token, one of the tooling housing assemblies 50 may be moved by a motor, for example in the manner illustrated, while the second tooling housing 50 remains stationary. This would also accomplish the desired variable center distance capability.

What is claimed is:

1. A drive mechanism for a component insertion machine, said drive mechanism comprising:

a housing;

an elongated pinion gear rotatably mounted to said housing;

a first motor coupled to said pinion gear so as to rotationally drive said pinion gear;

a first tooling assembly mounted to said housing proximate said pinion gear so as to be reciprocally moveable relative to said pinion gear;

a first gear rack mounted to said first tooling assembly so as to engage said pinion gear;

a second tooling assembly mounted to said housing proximate said pinion gear so as to be reciprocally moveable relative to said pinion gear;

a second gear rack mounted to said second tooling assembly so as to engage said pinion gear;

drive means for moving at least one of said tooling assemblies so as to laterally adjust said first tooling relative to said second tooling assembly.

2. The drive mechanism of claim 1 wherein said first tooling assembly and said second tooling assembly are mounted to said housing by at least one linear bearing and at least one bearing shaft.

3. The drive mechanism of claim 1 wherein said drive means comprises means to move said first and said second tooling assemblies so as to laterally adjust said first and said second tooling assemblies relative to each other.

4. The drive mechanism of claim 1 wherein said drive means comprises a second motor coupled to said at least one tooling assembly by a lead screw.

5. The drive mechanism of claim 4 wherein said second motor is coupled to said first and said second tooling assemblies by said lead screw so as to laterally adjust said first and said second tooling assemblies relative to each other.

6. A drive mechanism for a component insertion machine, said drive mechanism comprising:
   housing means;
   a pair of adjacent tooling means mounted to said housing means;
   means for laterally adjusting said pair of tooling means relative to each other; and
   rack and pinion gear means to reciprocally drive said pair of tooling means.

7. A mechanism for insertion of a component into a printed circuit board, the mechanism comprising:
   first and second tooling assemblies adapted to engage respective first and second ends of the component;
   a lead screw width adjustment mechanism coupled with the first and second tooling assemblies and adapted to adjust a separation distance between the assemblies;
   a pinion gear; and
   first and second racks connected with respective first and second tooling assemblies and engaged with the pinion gear.

8. The mechanism according to claim 7, wherein the lead screw width adjustment mechanism further comprises:
   a lead screw;
   a threaded bushing mounted to the first tooling assembly and threaded onto the lead screw; and
   a servo motor adapted to rotate the lead screw, wherein rotation of the lead screw moves the first tooling assembly relative to the second tooling assembly.

9. The mechanism according to claim 8, wherein the lead screw width adjustment mechanism further comprises a housing adapted to slidably support the first and second tooling assemblies, and a second threaded bushing connected with the second tooling assembly and threaded onto the lead screw, wherein rotation of the lead screw moves both the first and second tooling assemblies relative to one another along the housing.

10. The mechanism according to claim 8, wherein the lead screw width adjustment mechanism further comprises a housing adapted to slidably support the first and second tooling assemblies, a second lead screw, a second servo motor adapted to rotate the second lead screw, and a second threaded bushing connected with the second tooling assembly and threaded onto the second lead screw, wherein rotation of the lead screw by the servo motor moves the first tooling assembly along the housing and rotation of the second lead screw by the second servo motor moves the second tooling assembly along the housing.

* * * * *